US006993085B2

(12) United States Patent
Le Dantec

(10) Patent No.: US 6,993,085 B2
(45) Date of Patent: Jan. 31, 2006

(54) ENCODING AND DECODING METHODS AND DEVICES AND SYSTEMS USING THEM

(75) Inventor: Claude Le Dantec, Saint Hilaire des Landes (FR)

(73) Assignee: Canon Kabushiki Kaisha, Tokyo (JP)

(*) Notice: Subject to any disclaimer, the term of this patent is extended or adjusted under 35 U.S.C. 154(b) by 842 days.

(21) Appl. No.: 09/826,148

(22) Filed: Apr. 5, 2001

(65) Prior Publication Data

US 2002/0021763 A1 Feb. 21, 2002

(30) Foreign Application Priority Data

Apr. 18, 2000 (FR) ........................................... 00 04988

(51) Int. Cl.
*H04L 27/20* (2006.01)
*H03M 13/23* (2006.01)

(52) U.S. Cl. ....................... 375/295; 375/259; 375/265; 714/786

(58) Field of Classification Search ................. 375/295, 375/232, 262, 286, 341; 382/232; 714/755, 714/758, 752, 786; 341/107; 370/487
See application file for complete search history.

(56) References Cited

U.S. PATENT DOCUMENTS 5,881,073 A * 3/1999 Wan et al. .................. 714/786
6,404,360 B1 * 6/2002 Piret et al. ..................... 341/81
6,438,112 B1 * 8/2002 Piret et al. .................. 370/298
6,442,728 B1 * 8/2002 Cui et al. ................... 714/786
6,523,146 B1 * 2/2003 Ishikawa .................... 714/786
6,530,059 B1 * 3/2003 Crozier et al. .............. 714/786
6,560,362 B1 * 5/2003 Piret et al. .................. 382/232
6,578,170 B1 * 6/2003 Piret et al. .................. 714/758
6,621,873 B1 * 9/2003 Kim et al. .................. 375/295
6,638,318 B1 * 10/2003 Piret et al. .................. 714/781
6,766,489 B1 * 7/2004 Piret et al. .................. 714/755

FOREIGN PATENT DOCUMENTS

EP 0928071 7/1999
FR 2773287 7/1999

OTHER PUBLICATIONS

Berrou C., et al., "Multiple Parallel Concatenation Of Circular Recursive Systematic Convolutional (CRSC) Codes", Annales Des Telecommunications, vol. 54, No. 3/04, 1999, pp. 166–172.
Berrou C., et al., "Frame–Oriented Convolutional Turbo Codes", Electronics Letters, vol. 32, No. 15, Jul. 18, 1996, pp. 1362–1364.

(Continued)

*Primary Examiner*—Amanda T. Le
*Assistant Examiner*—Lawrence B. Williams
(74) *Attorney, Agent, or Firm*—Fitzpatrick, Cella, Harper & Scinto

(57) ABSTRACT

For encoding a source sequence of symbols ($\underline{u}$) as an encoded sequence, the source sequence ($\underline{u}$) is divided into $p_1$ first sub-sequences ($\underline{U}_i$), $p_1$ being a positive integer, and each of the first sub-sequences ($\underline{U}_i$) is encoded in a first circular convolutional encoding method. The source sequence ($\underline{u}$) is interleaved into an interleaved sequence ($\underline{u}^*$), and the interleaved sequence ($\underline{u}^*$) is divided into $p_2$ second sub-sequences ($\underline{U}'_i$), $p_2$ being a positive integer. Each of the second sub-sequences ($\underline{U}'_i$) is encoded in a second circular convolutional encoding method. At least one of the integers $p_1$ and $p_2$ is strictly greater than 1 and at least one of the first sub-sequences ($\underline{U}_i$) is not interleaved into any of the second sub-sequences ($\underline{U}'_j$).
(It is noted that the above underlining of the following symbols is original, and is meant to be permanent: $\underline{u}$, $\underline{U}_i$, $\underline{u}^*$, $\underline{U}'_i$, $\underline{U}'_j$).

34 Claims, 7 Drawing Sheets

OTHER PUBLICATIONS

Gueguen A. et al., "Performance Of Frame Oriented Turbo Codes On UMTS Channel With Various Termination Schemes", Electronics, VNU Business Publications, vol. 3, 1999, pp. 1550–1554.

Anderson J. B., et al., "Tailbiting MAP Decoders", IEEE Journal On Selected Areas In Communications, vol. 16, No. 2, Feb. 1988, pp. 297–302.

Berrou C. et al., "Near Shannon Limit Error–Correcting Coding And Decoding: Turbo–Codes(1)", Proceedings Of The International Conference On Communications (ICC), US, New York, IEEE, vol. 2/3, May 23, 1993, pp. 1064–1070.

Benedetto S. et al., "Serial Concatenation Of Interleaved Codes: Performance Analysis, Design, and Iterative Decoding", TDA Progress Report 42–126, Aug. 15, 1996, pp. 1–26.

Benedetto S. et al., "Soft–Output Decoding Algorithms In Iterative Decoding Of Turbo Codes", TDA Progress Report 42–124, Feb. 15, 1996, pp. 63–87.

Divsalar D. et al., "On The Design Of Turbo Codes", TDA Progress Report 42–123, Nov. 15, 1995, pp. 99–121.

Bahl L. R., "Optimal Decoding Of Linear Codes For Minimizing Symbol Error Rate", IEEE Transactions On Information Theory, Mar. 1974, pp. 284–287.

Hagenauer J. et al., "A Viteri Algorithm Wigh Soft–Decision Outputs And Its Applications", IEEE, 1989, pp. 1680–1686.

* cited by examiner

ENCODING AND DECODING METHODS AND DEVICES AND SYSTEMS USING THEM

The present invention relates to encoding and decoding methods and devices and to systems using them.

Conventionally, a turbo-encoder consists of three essential parts: two elementary recursive systematic convolutional encoders and one interleaver.

The associated decoder consists of two elementary soft input soft output decoders corresponding to the convolutional encoders, an interleaver and its reverse interleaver (also referred to as a "deinterleaver").

A description of turbocodes will be found in the article "*Near Shannon limit error-correcting encoding and decoding: turbo codes*" corresponding to the presentation given by C. Berrou, A. Glavieux and P. Thitimajshima during the ICC conference in Geneva in May 1993.

The encoders being recursive and systematic, one problem which is often found is that of the zeroing of the elementary encoders.

In the prior art various ways of dealing with this problem are found, in particular:

1. No return to zero: the encoders are initialised to the zero state and are left to evolve to any state without intervening.

2. Resetting the first encoder to zero: the encoders are initialised to the zero state and padding bits are added in order to impose a zero final state solely on the first encoder.

3. "Frame Oriented Convolutional Turbo Codes" (FOCTC): the first encoder is initialised and the final state of the first encoder is taken as the initial state of the second encoder. When a class of interleavers with certain properties is used, the final state of the second encoder is zero. Reference can usefully be made on this subject to the article by C. Berrou and M. Jezequel entitled "*Frame oriented convolutional turbo-codes*", in Electronics Letters, Vol. 32, N° 15, 18, Jul. 1996, pages 1362 to 1364, Stevenage, Herts, Great Britain.

4. Independent resetting to zero of the two encoders: the encoders are initialised to the zero state and padding bits are added independently to each of the sequences entering the encoders. A general description of independent resetting to zero of the encoders is given in the report by D. Divsalar and F. Pollara entitled "*TDA progress report* 42–123 *On the design of turbo codes*", published in Nov. 1995 by JPL (Jet Propulsion Laboratory).

5. Intrinsic resetting to zero of the two encoders: the encoders are initialised to the zero state and padding bits are added to the sequence entering the first encoder. When an interleaver is used guaranteeing return to zero as disclosed in the patent document FR-A-2 773 287 and the sequence comprising the padding bits is interleaved, the second encoder automatically has a zero final state.

6. Use of circular encoders (or "tail-biting encoders"). A description of circular concatenated convolutional codes will found in the article by C. Berrou, C. Douillard and M. Jezequel entitled "*Multiple parallel concatenation of circular recursive systematic codes*", published in "Annales des Télécommunications", Vol. 54, Nos. 3–4, pages 166 to 172, 1999. In circular encoders, an initial state of the encoder is chosen such that the final state is the same.

For each of the solutions of the prior art mentioned above, there exists a trellis termination adapted for each corresponding decoder. These decoders take into account the termination or not of the trellises, as well as, where applicable, the fact that each of the two encoders uses the same padding bits.

Turbodecoding is an iterative operation well known to persons skilled in the art. For more details, reference can be made to:

the report by S. Benedetto, G. Montorsi, D. Divsalar and F. Pollara entitled "*Soft Output decoding algorithms in Iterative decoding of turbo codes*" published by JPL in TDA Progress Report 42–124, in February 1996;

the article by L. R Bahl, J. Cocke, F. Jelinek and J. Raviv entitled "*Optimal decoding of linear codes for minimizing symbol error rate*", published in IEEE Transactions on Information Theory, pages 284 to 287 in March 1974.

Solutions 1 and 2 generally offer less good performance than solutions 3 to 6.

However, solutions 3 and 4 also have drawbacks.

Solution 3 limits the choice of interleavers, which risks reducing the performance or unnecessarily complicates the design of the interleaver.

When the size of the interleaver is small, solution 4 has less good performance than solutions 5 and 6.

Solutions 5 and 6 therefore seem to be the most appropriate.

However, solution 5 has the drawback of requiring padding bits, which is not the case with solution 6.

Solution 6 therefore seems of interest. Nevertheless, this solution has the drawback of requiring pre-encoding, as specified in the document entitled "*Multiple parallel concatenation of circular recursive systematic codes*" cited above. The duration of pre-encoding is not an insignificant constraint. This duration is the main factor in the latency of the encoder, that is to say the delay between the inputting of a first bit into the encoder and the outputting of a first encoded bit. This is a particular nuisance for certain applications sensitive to transmission times.

The aim of the present invention is to remedy the aforementioned drawbacks.

It makes it possible in particular to obtain good performance whilst not requiring any padding bits and limiting the pre-encoding latency.

For this purpose, the present invention proposes a method for encoding a source sequence of symbols as an encoded sequence, remarkable in that it includes steps according to which:

a first operation is performed of division into sub-sequences and encoding, consisting of dividing the source sequence into $p_1$ first sub-sequences, $p_1$ being a positive integer, and encoding each of the first sub-sequences using a first circular convolutional encoding method;

an interleaving operation is performed, consisting of interleaving the source sequence into an interleaved sequence; and a second operation is performed of division into sub-sequences and encoding, consisting of dividing the interleaved sequence into $p_2$ second sub-sequences, $p_2$ being a positive integer, and encoding each of the second sub-sequences by means of a second circular convolutional encoding method; at least one of the integers $p_1$ and $p_2$ being strictly greater than 1 and at least one of the first sub-sequences not being interleaved into any of the second sub-sequences.

Such an encoding method is particularly well adapted to turbocodes offering good performance, not requiring any padding bits and giving rise to a relatively low encoding latency.

In addition, it is particularly simple to implement.

According to a particular characteristic, the first or second circular convolutional encoding method includes:

a pre-encoding step, consisting of defining the initial state of the encoding method for the sub-sequence in question, so as to produce a pre-encoded sub-sequence, and a circular convolutional encoding step.

The advantage of this characteristic is its simplicity in implementation.

According to a particular characteristic, the pre-encoding step is performed simultaneously for one of the first sub-sequences and the circular convolutional encoding step for another of the first sub-sequences already pre-encoded.

This characteristic makes it possible to reduce the encoding latency to a significant extent.

According to a particular characteristic, the integers $p_1$ and $p_2$ are equal.

This characteristic confers symmetry on the method whilst being simple to implement.

According to a particular characteristic, the size of all the sub-sequences is identical.

The advantage of this characteristic is its simplicity in implementation.

According to a particular characteristic, the first and second circular convolutional encoding methods are identical, which makes it possible to simplify the implementation.

According to a particular characteristic, the encoding method also includes steps according to which:

an additional interleaving operation is performed, consisting of interleaving the parity sequence resulting from the first operation of dividing into sub-sequences and encoding; and a third operation is performed of division into sub-sequences and encoding, consisting of dividing the interleaved sequence obtained at the end of the additional interleaving operation into $p_3$ third sub-sequences, $p_3$ being a positive integer, and encoding each of the third sub-sequences by means of a third circular convolutional encoding method.

This characteristic has the general advantages of serial or hybrid turbocodes; good performances are notably obtained, in particular with a low signal to noise ratio.

For the same purpose as mentioned above, the present invention also proposes a device for encoding a source sequence of symbols as an encoded sequence, remarkable in that it has:

a first module for dividing into sub-sequences and encoding, for dividing the source sequence into $p_1$ first sub-sequences, $p_1$ being a positive integer, and for encoding each of the first sub-sequences by means of a first circular convolutional encoding module;

an interleaving module, for interleaving the source sequence into an interleaved sequence; and a second module for dividing into sub-sequences and encoding, for dividing the interleaved sequence into $p_2$ second sub-sequences, $p_2$ being a positive integer, and for encoding each of the second sub-sequences by means of a second circular convolutional encoding module; at least one of the integers $p_1$ and $p_2$ being strictly greater than 1 and at least one of the first sub-sequences not being interleaved into any of the second sub-sequences.

The particular characteristics and advantages of the encoding device being similar to those of the encoding method, they are not repeated here.

Still for the same purpose, the present invention also proposes a method for decoding a sequence of received symbols, remarkable in that it is adapted to decode a sequence encoded by an encoding method like the one above.

In a particular embodiment, the decoding method using a turbodecoding, there are performed iteratively:

a first operation of dividing into sub-sequences, applied to the received symbols representing the source sequence and a first parity sequence, and to the a priori information of the source sequence;

for each triplet of sub-sequences representing a sub-sequence encoded by a circular convolutional code, a first elementary decoding operation, adapted to decode a sequence encoded by a circular convolutional code and supplying a sub-sequence of extrinsic information on a sub-sequence of the source sequence;

an operation of interleaving the sequence formed by the sub-sequences of extrinsic information supplied by the first elementary decoding operation;

a second operation of dividing into sub-sequences, applied to the received symbols representing the interleaved sequence and a second parity sequence, and to the a priori information of the interleaved sequence;

for each triplet of sub-sequences representing a sub-sequence encoded by a circular convolutional code, a second elementary decoding operation, adapted to decode a sequence encoded by a circular convolutional code and supplying a sub-sequence of extrinsic information on a sub-sequence of the interleaved sequence;

an operation of deinterleaving the sequence formed by the extrinsic information sub-sequences supplied by the second elementary decoding operation.

Still for the same purpose, the present invention also proposes a device for decoding a sequence of received symbols, remarkable in that it is adapted to decode a sequence encoded by means of an encoding device like the one above.

The particular characteristics and advantages of the decoding device being similar to those of the decoding method, they are not stated here.

The present invention also relates to a digital signal processing apparatus, having means adapted to implement an encoding method and/or a decoding method as above.

The present invention also relates to a digital signal processing apparatus, having an encoding device and/or a decoding device as above.

The present invention also relates to a telecommunications network, having means adapted to implement an encoding method and/or a decoding method as above.

The present invention also relates to a telecommunications network, having an encoding device and/or a decoding device as above.

The present invention also relates to a mobile station in a telecommunications network, having means adapted to implement an encoding method and/or a decoding method as above.

The present invention also relates to a mobile station in a telecommunications network, having an encoding device and/or a decoding device as above.

The present invention also relates to a device for processing signals representing speech, having an encoding device and/or a decoding device as above.

The present invention also relates to a data transmission device having a transmitter adapted to implement a packet transmission protocol, having an encoding device and/or a decoding device and/or a device for processing signals representing speech as above.

According to a particular characteristic of the data transmission device, the packet transmission protocol is of the ATM (Asynchronous Transfer Mode) type.

As a variant, the packet transmission protocol is of the IP (Internet Protocol) type.

The invention also relates to:

an information storage means which can be read by a computer or microprocessor storing instructions of a computer program, permitting the implementation of an encoding method and/or a decoding method as above, and an information storage means which is removable, partially or totally, which can be read by a computer or microprocessor storing instructions of a computer program, permitting the implementation of an encoding method and/or a decoding method as above.

The invention also relates to a computer program containing sequences of instructions for implementing an encoding method and/or a decoding method as above.

The particular characteristics and the advantages of the different digital signal processing appliances, the different telecommunications networks, the different mobile stations, the device for processing signals representing speech, the data transmission device, the information storage means and the computer program being similar to those of the interleaving method according to the invention, they are not stated here.

Other aspects and advantages of the invention will emerge from a reading of the following detailed description of particular embodiments, given by way of non-limitative examples. The description refers to the drawings which accompany it, in which:

FIG. 1 illustrates schematically the constitution of a network station or computer encoding station, in the form of a block diagram.

Figure 1:
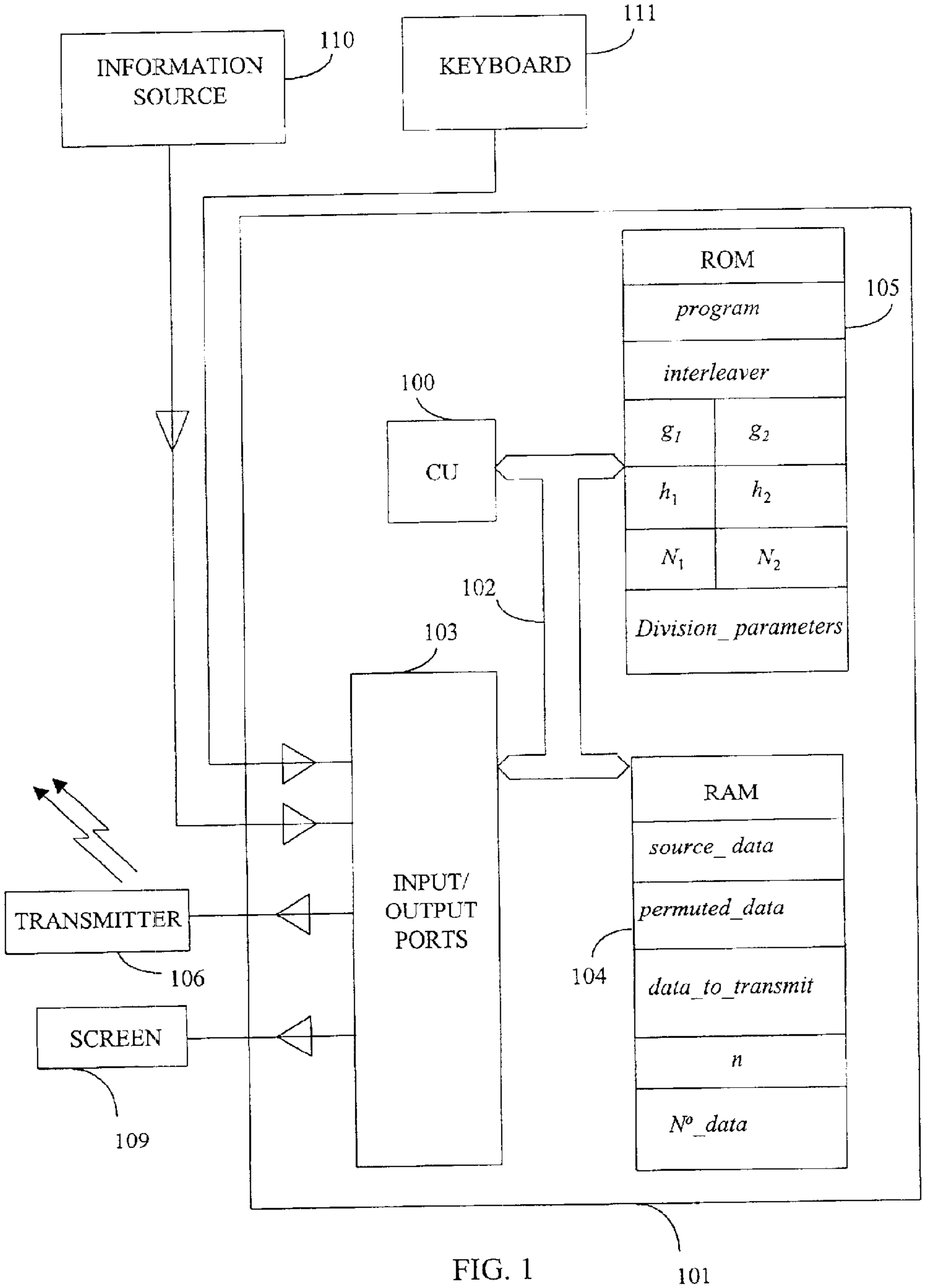
FIG. 1 depicts schematically an electronic device including an encoding device in accordance with the present invention, in a particular embodiment.

This station has a keyboard 111, a screen 109, an external information source 110 and a radio transmitter 106, conjointly connected to an input/output port 103 of a processing card 101.

The processing card 101 has, connected together by an address and data bus 102:

a central processing unit 100;

a random access memory RAM 104;

a read only memory ROM 105; and the input/output port 103.

Each of the elements illustrated in FIG. 1 is well known to persons skilled in the art of microcomputers and transmission systems and, more generally, information processing systems. These common elements are therefore not described here. It should however be noted that:

the information source 110 is, for example, an interface peripheral, a sensor, a demodulator, an external memory or other information processing system (not shown), and is preferably adapted to supply sequences of signals representing speech, service messages or multimedia data, in the form of sequences of binary data, and that the radio transmitter 106 is adapted to implement a packet transmission protocol on a non-cabled channel, and to transmit these packets over such a channel.

It should also be noted that the word "register" used in the description designates, in each of the memories 104 and 105, both a memory area of low capacity (a few binary data) and a memory area of large capacity (making it possible to store an entire program).

The random access memory 104 stores data, variables and intermediate processing results, in memory registers bearing, in the description, the same names as the data whose values they store. The random access memory 104 contains notably:

a register "source_data", in which there are stored, in the order of their arrival over the bus 102, the binary data coming from the information source 110, in the form of a sequence $\underline{u}$, a register "permuted_data", in which there are stored, in the order of their arrival over the bus 102, the permuted binary data, in the form of a sequence $\underline{u}^*$, a register "data_to_transmit", in which there are stored the sequences to be transmitted, a register "n", in which there is stored the value n of the size of the source sequence, and a register "N°_data", which stores an integer number corresponding to the number of binary data in the register "source_data".

The read only memory 105 is adapted to store, in registers which, for convenience, have the same names as the data which they store:

the operating program of the central processing unit 100, in a register "program", the array defining the interleaver, in a register "interleaver", the sequence $\underline{g}_1$, in a register "$g_1$", the sequence $\underline{g}_2$, in a register "$g_2$", the sequence $\underline{h}_1$, in a register "$h_1$", the sequence $\underline{h}_2$, in a register "$h_2$", the value of $N_1$, in a register "$N_1$", the value of $N_2$, in a register "$N_2$", and the parameters of the divisions into sub-sequences, in a register "Division_parameters", comprising notably the number of first and second sub-sequences and the size of each of them.

Figure 5:
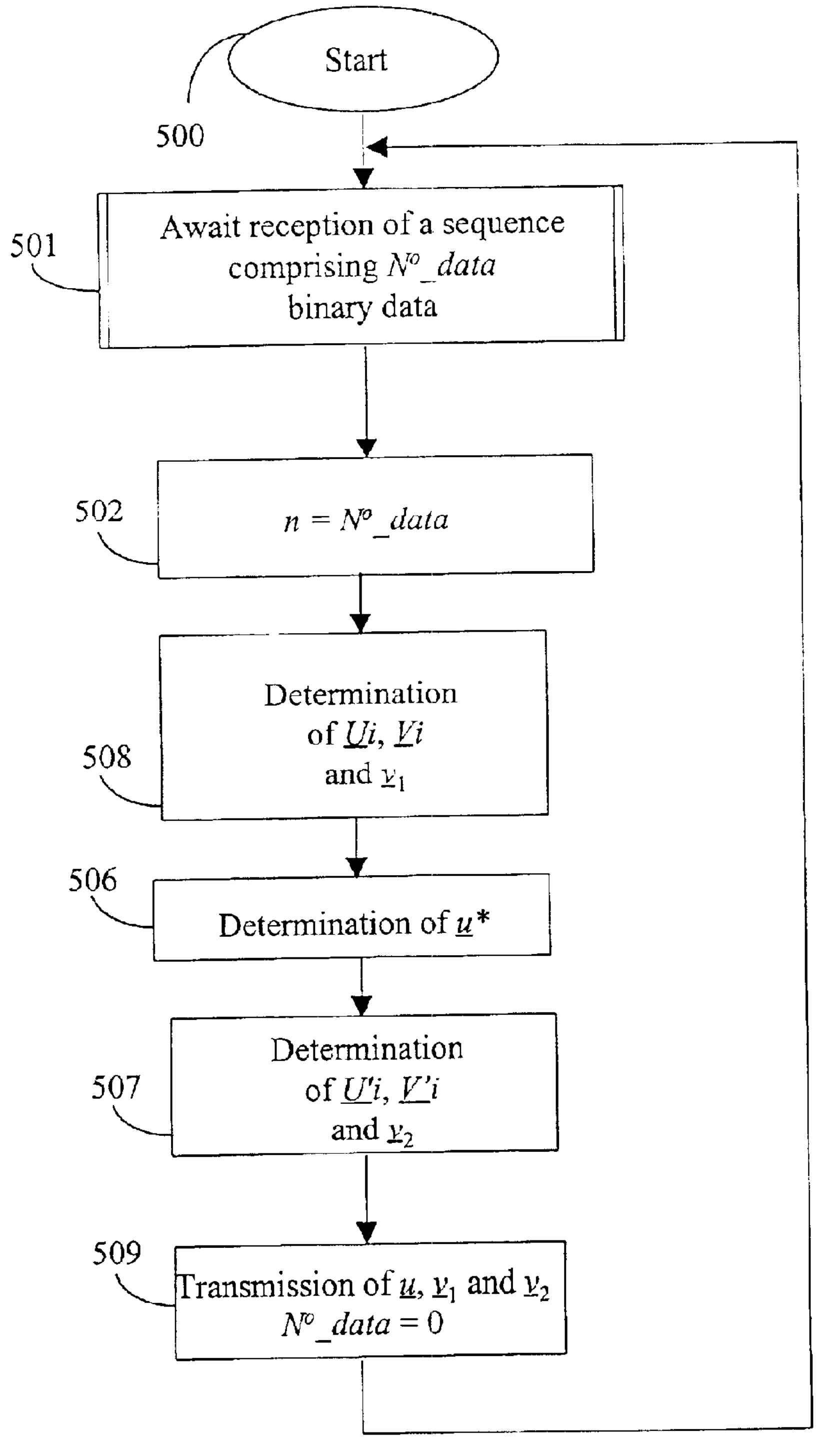
FIG. 5 is a flow diagram depicting schematically the functioning of an encoding device like the one included in the electronic device of FIG. 1, in a particular embodiment.

The central processing unit 100 is adapted to implement the flow diagram illustrated in FIG. 5.

Figure 2:
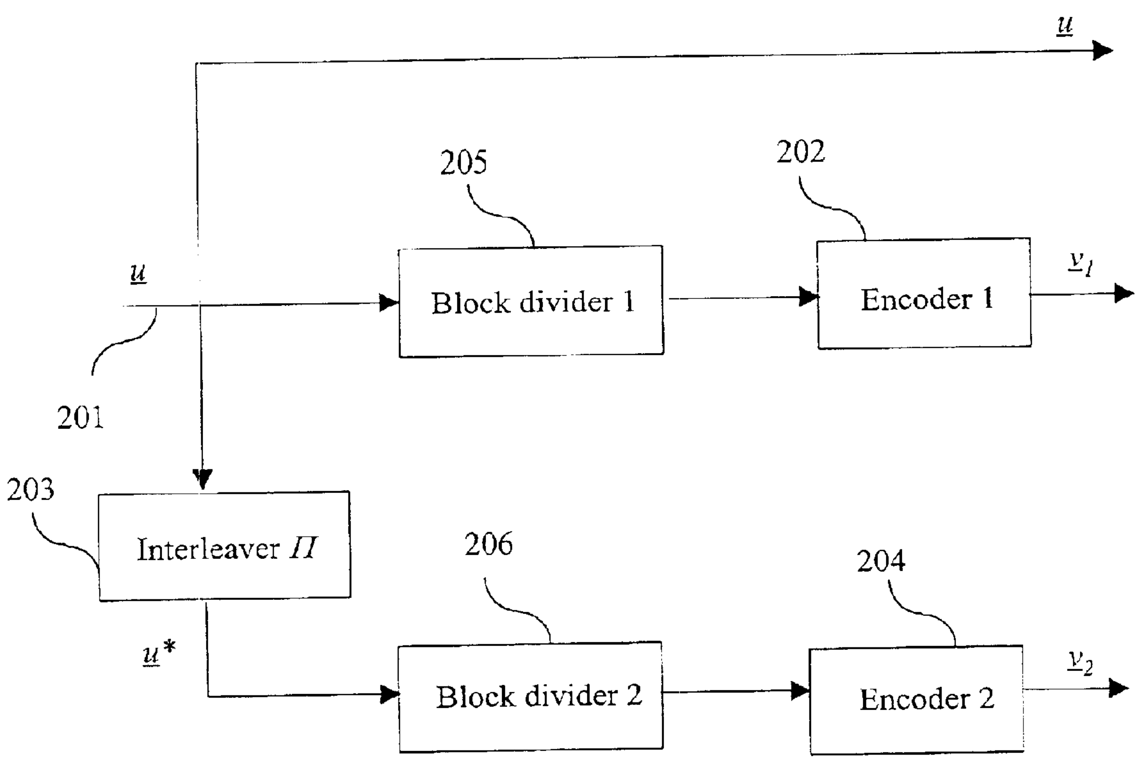
FIG. 2 depicts schematically, in the form of a block diagram, an encoding device corresponding to a parallel convolutional turbocode, in accordance with the present invention, in a particular embodiment.

It can be seen, in FIG. 2, that an encoding device corresponding to a parallel convolutional turbocode in accordance with the present invention has notably:

an input for symbols to be encoded 201, where the information source 110 supplies a sequence of binary symbols to be transmitted, or "to be encoded", $\underline{u}$, a first divider into sub-sequences 205, which divides the sequence $\underline{u}$ into $p_1$ sub-sequences $\underline{U}_1, \underline{U}_2, \ldots, \underline{U}_{p1}$, the value of $p_1$ and the size of each sub-sequence being stored in the register "Division_parameters" in the read only memory 105, a first encoder 202 which supplies, from each sequence $\underline{U}_i$, a sequence $\underline{V}_i$ of symbols representing the sequence $\underline{U}_i$, all the sequences $\underline{V}_i$ constituting a sequence $\underline{v}_1$, an interleaver 203 which supplies, from the sequence $\underline{u}$, an interleaved sequence $\underline{u}^*$, whose symbols are the symbols of the sequence $\underline{u}$, but in a different order, a second divider into sub-sequences 206, which divides the sequence $\underline{u}^*$ into $p_2$ sub-sequences $U'_1$, $U'_2$, . . . , $U'_{p2}$, the value of $p_2$ and the size of each sub-sequence being stored in the register "Division_parameters" of the read only memory 105, and a second encoder 204 which supplies, from each sequence $U'_i$, a sequence $V'_i$ of symbols representing the sequence $U'_i$, all the sequences $V'_i$ constituting a sequence $\underline{v}_2$.

The three sequences $\underline{u}$, $\underline{v}_1$ and $\underline{v}_2$ constitute an encoded sequence which is transmitted in order then to be decoded.

The first and second encoders are adapted:

on the one hand, to effect a pre-encoding of each sub-sequence, that is to say to determine an initial state of the encoder such that its final state after encoding of the sub-sequence in question will be identical to this initial state, and on the other hand, to effect the recursive convolutional encoding of each sub-sequence by multiplying by a multiplier polynomial ($\underline{h}_1$ for the first encoder and $\underline{h}_2$ for the second encoder) and by dividing by a divisor polynomial ( $\underline{g}_1$ for the first encoder and $\underline{g}_2$ for the second encoder), considering the initial state of the encoder defined by the pre-encoding method.

The smallest integer $N_i$ such that $\underline{g}_i(x)$ is a divisor of the polynomial $x^{Ni}+1$ is referred to as the period $N_i$ of the polynomial $\underline{g}_i(x)$.

Each of the sub-sequences obtained by the first (or respectively second) divider into sub-sequences will have a length which will not be a multiple of $N_1$, period of $\underline{g}_1$ (or respectively $N_2$, period of $\underline{g}_2$) in order to make possible the encoding of this sub-sequence by a circular recursive code.

In addition, preferably, this length will be neither too small (at least around five times the degree of the generator polynomials of the first (or respectively second) convolutional code) in order to keep good performance for the code, nor too large, in order to limit latency.

In order to simplify the implementation, identical encoders can be chosen ($\underline{g}_1$ then being equal to $\underline{g}_2$ and $\underline{h}_1$ being equal to $\underline{h}_2$).

Likewise, the values of $p_1$ and $p_2$ can be identical.

Still by way of simplification of the implementation of the invention, all the sub-sequences can be of the same size (not a multiple of $N_1$ or $N_2$).

In the preferred embodiment, each of the encoders will consist of a pre-encoder and a recursive convolutional encoder placed in cascade. In this way, it will be adapted to be able to simultaneously effect the pre-encoding of a sub-sequence and the recursive convolutional encoding of another sub-sequence which will previously have been pre-encoded. Thus both the overall duration of encoding and the latency will be optimised.

As a variant, an encoder will be indivisible: the same resources are used both for the pre-encoder and the convolutional encoder. In this way, the number of resources necessary will be reduced whilst optimising the latency.

The interleaver will be such that at least one of the sequences $\underline{U}_i$ (with i between 1 and $p_1$ inclusive) is not interleaved in any sequence $U'_j$ (with j between 1 and $p_2$ inclusive). The invention is thus clearly distinguished from the simple concatenation of convolutional circular turbocodes.

Figure 3:
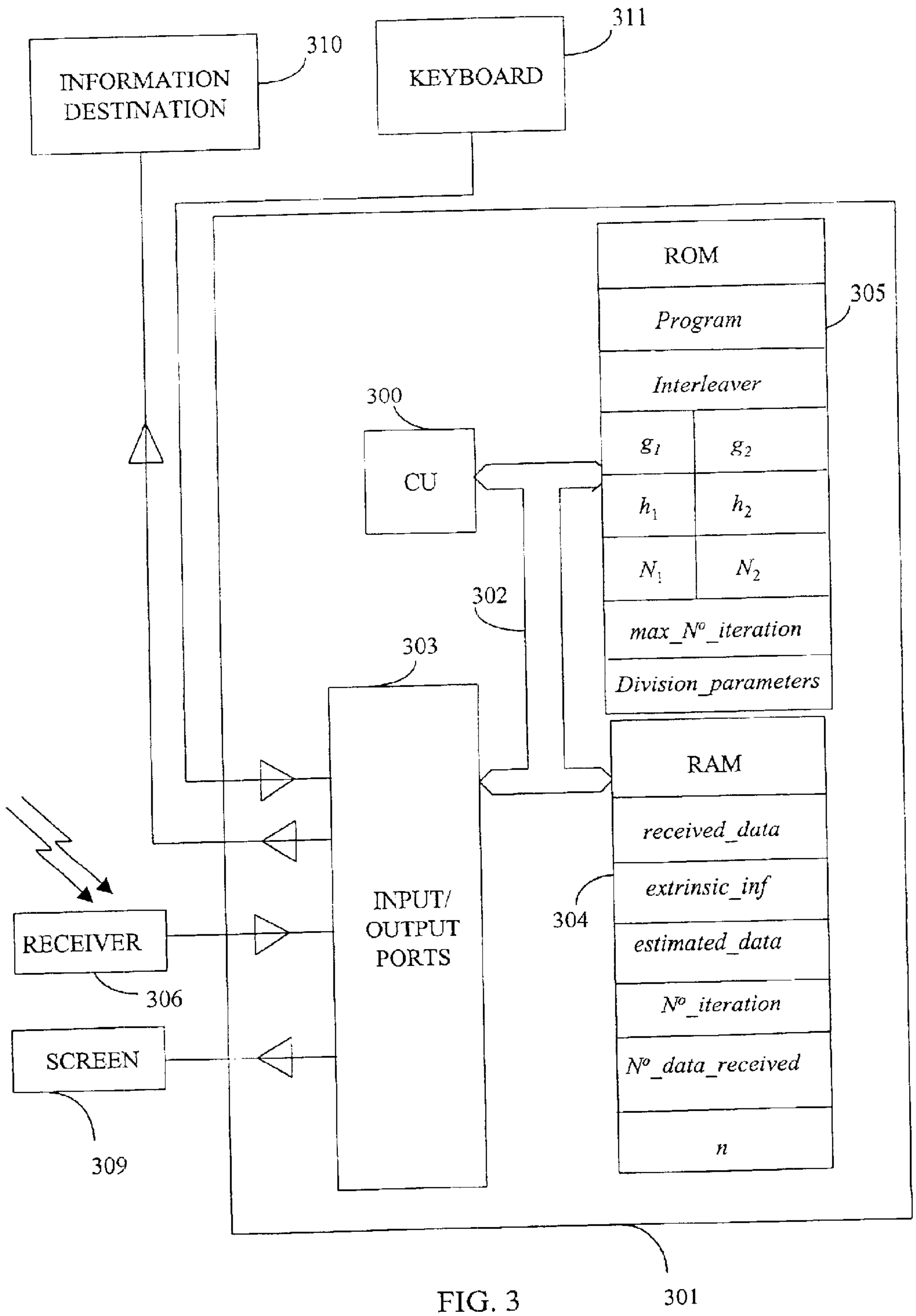
FIG. 3 depicts schematically an electronic device including a decoding device in accordance with the present invention, in a particular embodiment.

FIG. 3 illustrates schematically the constitution of a network station or computer decoding station, in the form of a block diagram.

This station has a keyboard 311, a screen 309, an external information source 310 and a radio receiver 306, conjointly connected to an input/output port 303 of a processing card 301.

The processing card 301 has, connected together by an address and data bus 302:

a central processing unit 300;

a random access memory RAM 304;

a read only memory ROM 305; and the input/output port 303.

Each of the elements illustrated in FIG. 3 is well known to persons skilled in the art of microcomputers and transmission systems and, more generally, information processing systems. These common elements are therefore not described here. It should however be noted that:

the information destination 310 is, for example, an interface peripheral, a display, a modulator, an external memory or other information processing system (not shown), and is advantageously adapted to receive sequences of signals representing speech, service messages or multimedia data, in the form of sequences of binary data, and that the radio receiver 306 is adapted to implement a packet transmission protocol on a non-cabled channel, and to receive these packets over such a channel.

It should also be noted that the word "register" used in the description designates, in each of the memories 304 and 305, both a memory area of low capacity (a few binary data) and a memory area of large capacity (making it possible to store an entire program).

Figure 4:
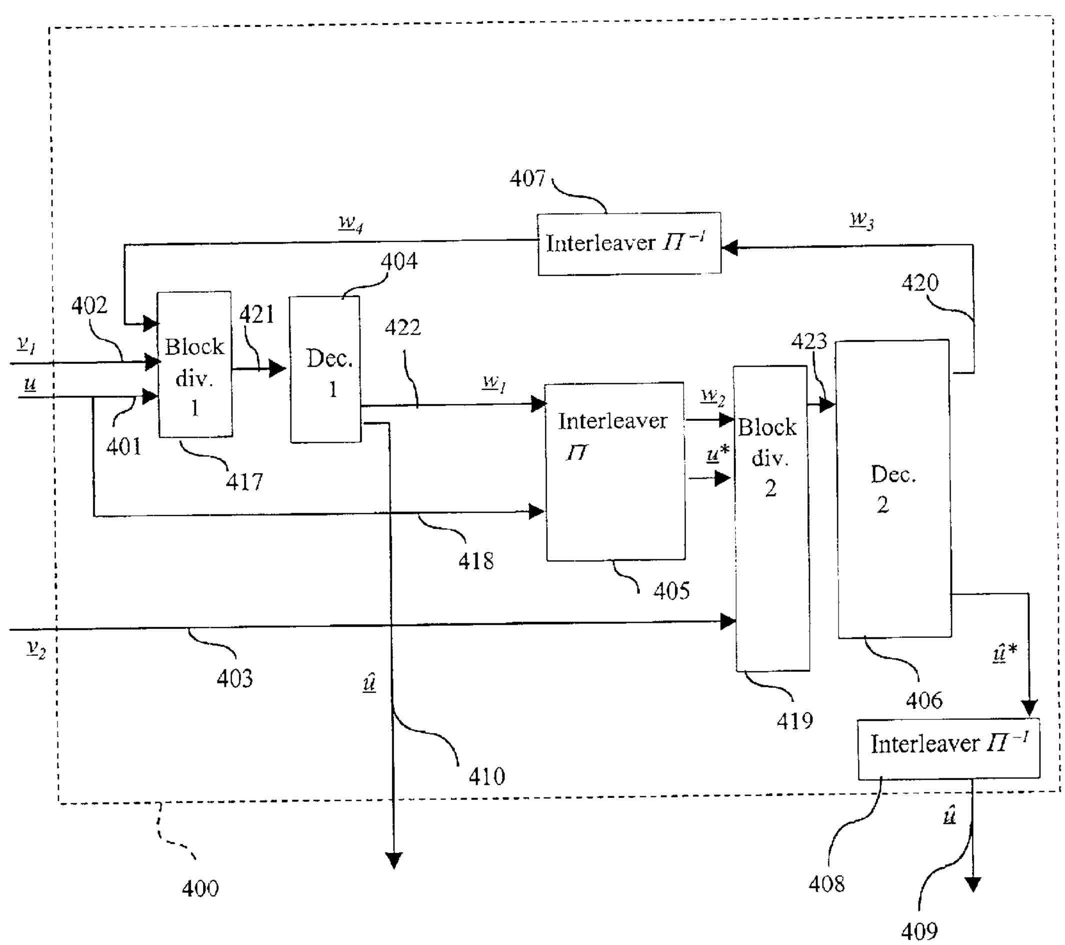
FIG. 4 depicts schematically, in the form of a block diagram, a decoding device corresponding to a parallel convolutional turbocode, in accordance with the present invention, in a particular embodiment.

The random access memory 304 stores data, variables and intermediate processing results, in memory registers bearing, in the description, the same names as the data whose values they store. The random access memory 304 contains notably:

a register "data_received", in which there are stored, in the order of arrival of the binary data over the bus 302 coming from the transmission channel, a soft estimation of these binary data, equivalent to a measurement of reliability, in the form of a sequence r, a register "extrinsic_inf", in which there are stored, at a given instant, the extrinsic and a priori information corresponding to the sequence $\underline{u}$, a register "estimated_data", in which there is stored, at a given instant, an estimated sequence û supplied as an output by the decoding device of the invention, as described below with the help of FIG. 4, a register "N°_iteration", which stores an integer number corresponding to a counter of iterations effected by the decoding device concerning a received sequence $\underline{u}$, as described below with the help of FIG. 4, a register "N°_received_data", which stores an integer number corresponding to the number of binary data contained in the register "received_data", and the value of n, the size of the source sequence, in a register "n".

The read only memory 305 is adapted to store, in registers which, for convenience, have the same names as the data which they store:

the operating program of the central processing unit 300, in a register "Program", the array defining the interleaver and its reverse interleaver, in a register "Interleaver", the sequence $\underline{g}_1$, in a register "$g_1$", the sequence $\underline{g}_2$, in a register "$g_2$", the sequence $\underline{h}_1$, in a register "$h_1$", the sequence $\underline{h}_2$, in a register "$h_2$", the value of $N_1$, in a register "$N_1$", the value of $N_2$, in a register "$N_2$", the maximum number of iterations to be effected during the operation 603 of turbodecoding a received sequence$\underline{u}$ (see FIG. 6 described below), in a register "max_N°_iteration", and the parameters of the divisions into sub-sequences, in a register "Division_parameters" identical to the register with the same name in the read only memory 105 of the processing card 101.

Figure 6:
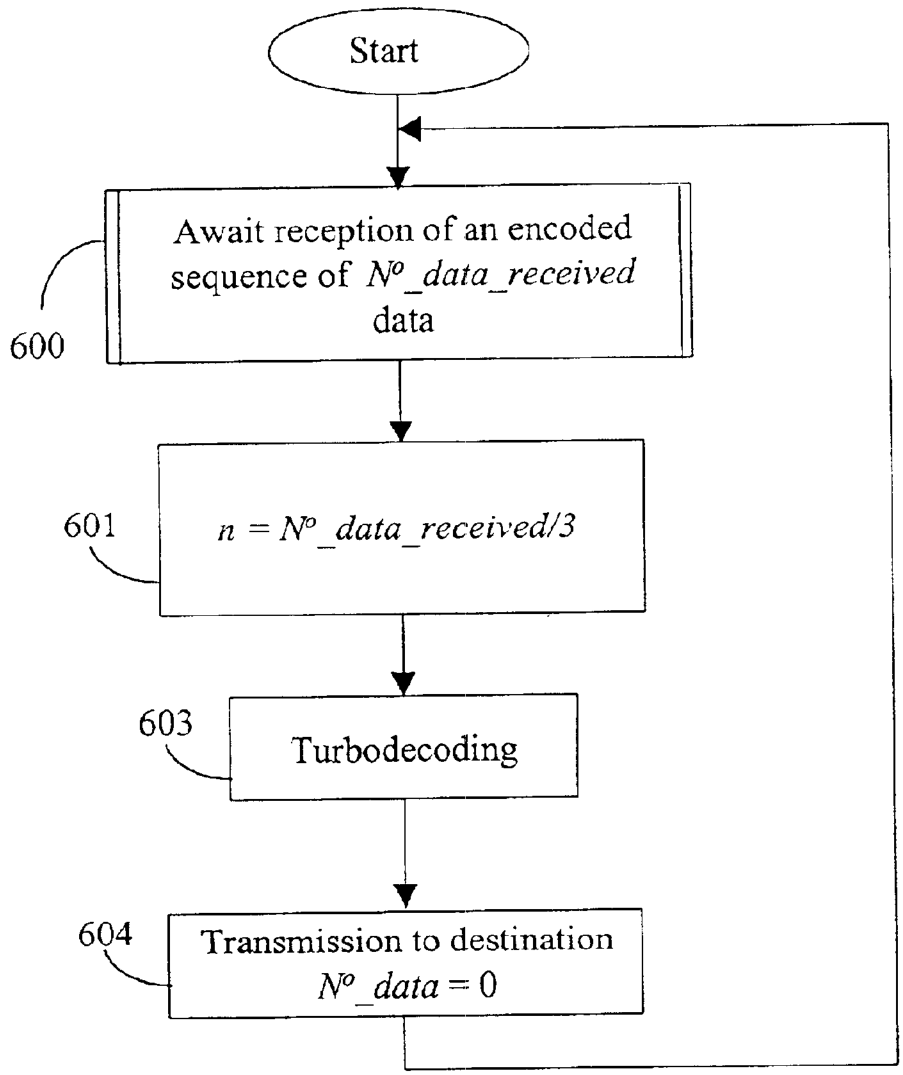
FIG. 6 is a flow diagram depicting schematically decoding and error correcting operations implemented by a decoding device like the one included in the electronic device of FIG. 3, in accordance with the present invention, in a particular embodiment.

The central processing unit 300 is adapted to implement the flow diagram illustrated in FIG. 6.

In FIG. 4, it can be seen that a decoding device 400 adapted to decode the sequences issuing from an encoding device like the one included in the electronic device of FIG. 1 or the one of FIG. 2 has notably:

three inputs 401, 402 and 403 for sequences representing $\underline{u}$, $\underline{v}_1$ and $\underline{v}_2$ which, for convenience, are also denoted $\underline{u}$, $\underline{v}_1$ and $\underline{v}_2$, the received sequence, consisting of these three sequences, being denoted r;

a first divider into sub-sequences 417 receiving as an input:

the sequences $\underline{u}$ and $\underline{v}_1$, and an a priori information sequence $\underline{w}_4$ described below.

The first divider 417 of the decoding device 400 corresponds to the first divider into sub-sequences 205 of the encoding device described above with the help of FIG. 2.

The first divider into sub-sequences 417 supplies as an output sub-sequences issuing from$\underline{u}$ and $\underline{w}_4$ (or respectively $\underline{v}_1$) at an output 421, each of the sub-sequences thus supplied representing a sub-sequence $\underline{U}_i$ (or respectively $\underline{V}_i$) as described with regard to FIG. 2.

The decoding device 400 also has:

a first soft input soft output decoder 404 corresponding to the encoder 202 (FIG. 2), adapted to decode sub-sequences encoded according to the circular recursive convolutional code of the encoder 202.

The first decoder 404 receives as an input the sub-sequences supplied by the first divider into sub-sequences 417.

For each value of i between 1 and $p_1$, from a sub-sequence of $\underline{u}$, a sub-sequence of $\underline{w}_4$, both representing a sub-sequence $\underline{U}_i$, and a sub-sequence of $\underline{v}_1$ representing $\underline{V}_i$, the first decoder 404 supplies as an output:

a sub-sequence of extrinsic information $\underline{w}_{1i}$ at an output 422, and an estimated sub-sequence $\hat{U}_i$ at an output 410.

All the sub-sequences of extrinsic information $\underline{w}_{1i}$, for i ranging from 1 to $p_1$, form an extrinsic information sequence $\underline{w}_1$ relating to the sequence $\underline{u}$.

All the estimated sub-sequences $\hat{U}_i$ with i ranging from 1 to $p_1$ is an estimate, denoted û, of the sequence $\underline{u}$.

The decoding device illustrated in FIG. 4 also has:

an interleaver 405 (denoted "Interleaver II" in FIG. 4), based on the same permutation as the one defined by the interleaver 203 used in the encoding device; the interleaver 405 receives as an input the sequences$\underline{u}$ and $\underline{w}_1$ and interleaves them respectively into sequences $\underline{u}^*$ and $\underline{w}_2$;

a second divider into sub-sequences 419 receiving as an input:

the sequences $\underline{u}^*$ and $\underline{v}_2$, and the a priori information sequence $\underline{w}_2$ issuing from the interleaver 405.

The second divider into sub-sequences 419 of the decoding device 400 corresponds to the second divider into sub-sequences 206 of the encoding device as described with regard to FIG. 2.

The second divider into sub-sequences 419 supplies as an output sub-sequences issuing from $\underline{u}^*$ and $\underline{w}_2$ (or respectively $\underline{v}_2$) at an output 423, each of the sub-sequences thus supplied representing a sub-sequence $U'_i$ (or respectively $V'_i$) as described with regard to FIG. 2.

The decoding device 400 also has:

a second soft input soft output decoder 406, corresponding to the encoder 204 (FIG. 2), adapted to decode sub-sequences encoded in accordance with the circular recursive convolutional code of the encoder 204.

The second decoder 406 receives as an input the sub-sequences supplied by the second divider into sub-sequences 419.

For each value of i between 1 and $p_2$, from a sub-sequence of $\underline{u}^*$, a sub-sequence of $\underline{w}_2$, both representing a sub-sequence $U'_i$, and a sub-sequence of $\underline{v}_2$ representing $V'_i$, the second decoder 406 supplies as an output:

a sub-sequence of extrinsic information $\underline{w}_{3i}$ at an output 420, and an estimated sub-sequence $\hat{U}_i$.

All the sub-sequences of extrinsic information $\underline{w}_{3i}$ for i ranging from 1 to $p_2$ form a sequence of extrinsic information $\underline{w}_3$ relating to the interleaved sequence $\underline{u}^*$.

All the estimated sub-sequences $\hat{U}_i$ for i ranging from 1 to $p_2$ are an estimate, denoted û*, of the interleaved sequence $\underline{u}^*$.

The decoding device illustrated in FIG. 4 also has:

a deinterleaver 408 (denoted "Interleaver $II^{-1}$" in FIG. 4), the reverse of the interleaver 405, receiving as an input the sequence û* and supplying as an output an estimated sequence û, at an output 409 (this estimate being improved with respect to the one supplied, half an iteration previously, at the output 410), this estimated sequence û being obtained by deinterleaving the sequence û*;

a deinterleaver 407 (also denoted "Interleaver $II^{-1}$" in FIG. 4), the reverse of the interleaver 405, receiving as an input the extrinsic information sequence $\underline{w}_3$ and supplying as an output the a priori information sequence $\underline{w}_4$;

the output 409, at which the decoding device supplies the estimated sequence û, output from the deinterleaver 408.

An estimated sequence û is taken into account only following a predetermined number of iterations (see the article "*Near Shannon limit error-correcting encoding and decoding: turbocodes*" cited above).

In FIG. 5, which depicts the functioning of an encoding device like the one included in the electronic device illustrated in FIG. 1, it can be seen that, after an initialisation operation 500, during which the registers of the random access memory 104 are initialised (N°_data="0"), during an operation 501, the central unit 100 waits to receive and then receives a sequence$\underline{u}$ of binary data to be transmitted, positions it in the random access memory 104 in the register "source_data" and updates the counter "N°_data".

Next, during an operation 502, the central unit 100 determines the value of n as being the value of the integer number stored in the register "N°_data" (the value stored in the random access memory 104).

Next, during an operation 508, the first encoder 202 (see FIG. 2) effects, for each value of i ranging from 1 to $p_1$:

the determination of a sub-sequence $\underline{U}_i$, the division of the polynomial $\underline{U}_i(x)$ by $\underline{g}_1(x)$, and the product of the result of this division and $\underline{h}_1(x)$, in order to form a sequence $\underline{V}_i$.

The sequences$\underline{u}$ and the result of these division and multiplication operations, $\underline{V}_i(=\underline{U}_i \cdot \underline{h}_1/g_1)$, are put in memory in the register "data_to_transmit".

Then, during an operation 506, the binary data of the sequence$\underline{u}$ are successively read in the register "data_to_transmit", in the order described by the array "interleaver" (interleaver of size n) stored in the read only memory 105. The data which result successively from this reading form a sequence $\underline{u}^*$ and are put in memory in the register "permuted_data" in the random access memory 104.

Next, during an operation 507, the second encoder 202 (see FIG. 2) effects, for each value of i ranging from 1 to $p_2$:

the determination of a sub-sequence $U'_i$, the division of the polynomial $U'_i(x)$ by $\underline{g}_2(x)$, and the product of the result of this division and $\underline{h}_2(x)$, in order to form a sequence $V'_i$.

The result of these division and multiplication operations, $V'_i(=U'_i \cdot \underline{h}_2/g_2)$, is put in memory in the register "data_to_transmit".

During an operation 509, the sequences $\underline{u}$, $\underline{v}_1$ (obtained by concatenation of the sequences $\underline{V}_i$) and $\underline{v}_2$ (obtained by concatenation of the sequences $V'_i$) are sent using, for this purpose, the transmitter 106. Next the registers in the memory 104 are once again initialised; in particular, the counter "N°_data" is reset to "0". Then operation 501 is reiterated.

As a variant, during the operation 509, the sequences $\underline{u}$, $\underline{v}_1$ and $\underline{v}_2$ are not sent in their entirety, but only a subset thereof. This variant is known to persons skilled in the art as puncturing.

In FIG. 6, which depicts the functioning of a decoding device like the one included in the electronic device illustrated in FIG. 3, it can be seen that, during an operation 600, the central unit 300 waits to receive and then receives a sequence of encoded data. Each data item is received in soft form and corresponds to a measurement of reliability of a data item sent by the transmitter 106 and received by the receiver 306. The central unit positions the received sequence in the random access memory 304, in the register "received_data" and updates the counter "N°_data_received".

Next, during an operation 601, the central unit 300 determines the value of n by effecting a division of "N°_data_received" by 3: n=N°_data_received/3. This value of n is then stored in the random access memory 304.

Next, during a turbodecoding operation 603, the decoding device gives an estimate û of the transmitted sequence $\underline{u}$.

Then, during an operation 604, the central unit 300 supplies this estimate û to the information destination 310.

Next the registers in the memory 304 are once again initialised. In particular, the counter "N°_data" is reset to "0" and operation 601 is reiterated.

Figure 7:
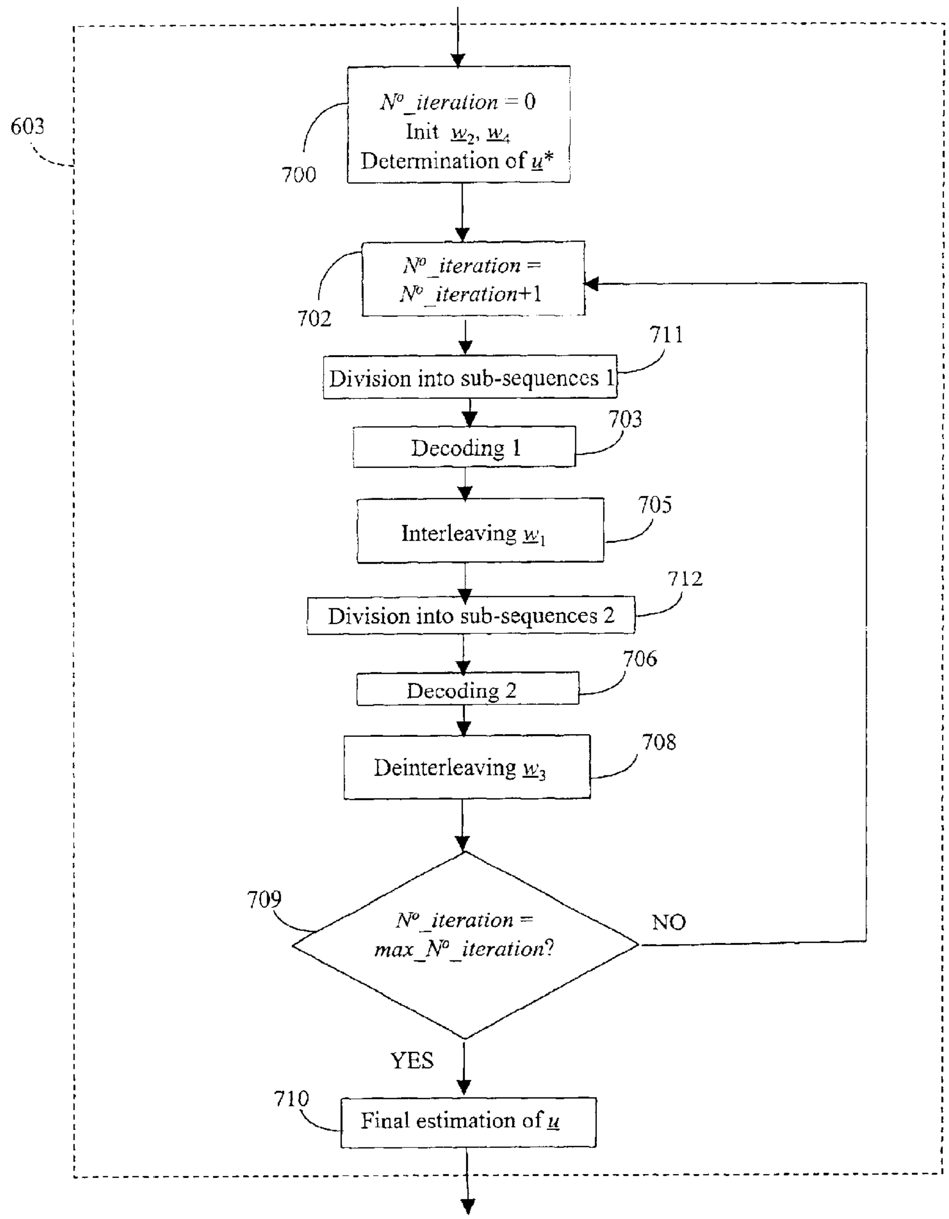
FIG. 7 is a flow diagram depicting schematically the turbodecoding operation proper included in the decoding method in accordance with the present invention.

In FIG. 7, which details the turbodecoding operation 603, it can be seen that, during an initialisation operation 700, the registers in the random access memory 304 are initialised: the a priori information $\underline{w}_2$ and $\underline{w}_4$ is reset to zero (it is assumed here that the entropy of the source is zero). In addition, the interleaver 405 interleaves the input sequence $\underline{u}$ and supplies a sequence $\underline{u}$* which is stored in the register "received_data".

Next, during an operation 702, the register "N°_iteration" is incremented by one unit.

Then, during an operation 711, the first divider into sub-sequences 417 performs a first operation of dividing into sub-sequences the sequences u and $\underline{v}_1$ and the a priori information sequence $\underline{w}_4$.

Then, during an operation 703, the first decoder 404 (corresponding to the first elementary encoder 202) implements an algorithm of the soft input soft output (SISO) type, well known to persons skilled in the art, such as the BCJR or SOVA (Soft Output Viterbi Algorithm), in accordance with a technique adapted to decode the circular convolutional codes, as follows: for each value of i ranging from 1 to $p_1$, the first decoder 404 considers as soft inputs an estimate of the sub-sequences $\underline{U}_i$ and $\underline{V}_i$ received and $\underline{w}_{4i}$ (a priori information on $\underline{U}_i$) and supplies, on the one hand, $\underline{w}_{1i}$ (extrinsic information on $\underline{U}_i$) and, on the other hand, an estimate $\hat{U}_i$ of the sequence $\underline{U}_i$.

For fuller details on the decoding algorithms used in the turbocodes, reference can be made to:

the article entitled "*Optimal decoding of linear codes for minimizing symbol error rate*" cited above, which describes the BCJR algorithm, generally used in relation to turbocodes; or the article by J. Hagenauer and P. Hoeher entitled "*A Viterbi algorithm with soft decision outputs and its applications*", published with the proceedings of the IEEE GLOBECOM conference, pages 1680–1686, in November 1989.

More particularly, for more details on the decoding of a circular convolutional code habitually used in turbodecoders, reference can usefully be made to the article by J. B. Anderson and S. Hladik entitled "*Tailbiting MAP decoders*" published in the IEEE Journal On Selected Areas in Telecommunications in February 1998.

During an operation 705, the interleaver 405 interleaves the sequence $\underline{w}_1$ obtained by concatenation of the sequences $\underline{w}_{1i}$ (for i ranging from 1 to $p_1$) in order to produce $\underline{w}_2$, a priori information on $\underline{u}$*.

Then, during an operation 712, the second divider into sub-sequences 419 performs a second operation of dividing into sub-sequences the sequences $\underline{u}$* and $\underline{v}_2$ and the a priori information sequence $\underline{w}_2$.

Next, during an operation 706, the second decoder 406 (corresponding to the second elementary encoder 204) implements an algorithm of the soft input soft output type, in accordance with a technique adapted to decode circular convolutional codes, as follows: for each value of i ranging from 1 to $p_2$, the second decoder 406 considers as soft inputs an estimate of the sub-sequences $U'_i$ and $V'_i$ received and $\underline{w}_{2i}$ (a priori information on $U'_i$) and supplies, on the one hand, $\underline{w}_{3i}$ (extrinsic information on $U'_i$) and, on the other hand, an estimate $\hat{U}'_i$ of the sequence $U'_i$.

During an operation 708, the deinterleaver 407 (the reverse interleaver of 405) deinterleaves the information sequence $\underline{w}_3$ obtained by concatenation of the sequences $\underline{w}_{3i}$ (for i ranging from 1 to $p_2$) in order to produce $\underline{w}_4$, a priori information on $\underline{u}$.

The extrinsic and a priori information produced during steps 711, 703, 705, 712, 706 and 708 are stored in the register "extrinsic inf" in the RAM 304.

Next, during a test 709, the central unit 300 determines whether or not the integer number stored in the register "N°_iteration" is equal to a predetermined maximum number of iterations to be performed, stored in the register "max_N°_iteration" in the ROM 305.

When the result of test 709 is negative, operation 702 is reiterated.

When the result of test 709 is positive, during an operation 710, the deinterleaver 408 (identical to the deinterleaver 407) deinterleaves the sequence û*, obtained by concatenation of the sequences $\hat{U}'_i$ (for i ranging from 1 to $p_2$), in order to supply a deinterleaved sequence to the central unit 300, which then converts the soft decision into a hard decision, so as to obtain a sequence û, estimated from $\underline{u}$.

In a more general variant, the invention is not limited to turbo-encoders (or associated encoding or decoding methods or devices) composed of two encoders or turbo-encoders with one input: it can apply to turbo-encoders composed of several elementary encoders or to turbo-encoders with several inputs, such as those described in the report by D. Divsalar and F. Pollara cited in the introduction.

In another variant, the invention is not limited to parallel turbo-encoders (or associated encoding or decoding methods or devices) but can apply to serial or hybrid turbocodes as described in the report "*TDA progress report* 42–126 *Serial concatenation of interleaved codes: "Performance analysis, design and iterative decoding*" by S. Benedetto, G. Montorsi, D. Divsalar and F. Pollara, published in August 1996 by JPL (Jet Propulsion Laboratory). In this case, the parity sequence $\underline{v}_1$ resulting from the first convolutional encoding is also interleaved and, during a third step, this interleaved sequence is also divided into $p_3$ third sub-sequences $U''_i$ and each of them is encoded in accordance with a circular encoding method, conjointly or not with a sequence $U'_i$. Thus a divider into sub-sequences will be placed before an elementary circular recursive encoder. It will simply be ensured that the size of each sub-sequence is not a multiple of the period of the divisor polynomial used in the encoder intended to encode this sub-sequence.

What is claimed is:

1. A method for encoding a source sequence of symbols ($\underline{u}$) as an encoded sequence, comprising the steps of:

performing a first operation of division into sub-sequences and encoding, consisting of dividing the source sequence ($\underline{u}$) into $p_1$ first sub-sequences ($\underline{U}_i$) $p_1$ being a positive integer, and encoding each of the first sub-sequences ($\underline{U}_i$) using a first circular convolutional encoding method;

performing an interleaving operation of interleaving the source sequence ($\underline{u}$) into an interleaved sequence ($\underline{u}$*); and performing a second operation of division into sub-sequences and encoding, including dividing the interleaved sequence ($\underline{u}$*) into $p_2$ second sub-sequences ($U'_i$), $p_2$ being a positive integer, and encoding each of the second sub-sequences ($\underline{U}'_i$) using a second circular convolutional encoding method, wherein at least one of the integers $p_1$ and $p_2$ being strictly greater than 1 and at least one of the first sub-sequences ($\underline{U}_i$) not being interleaved into any of the second sub-sequences ($\underline{U}'_j$).

2. The encoding method according to claim 1, in which said first or second circular convolutional encoding method includes:

a pre-encoding step, of defining an initial state of said encoding method for the sub-sequence in question, so as to produce a pre-encoded sub-sequence, and a circular convolutional encoding step.

3. The encoding method according to claim 2, in which said pre-encoding step for one of the first sub-sequences ($\underline{U}_i$) and said circular convolutional encoding step for another one of the first sub-sequences ($\underline{U}_j$) already pre-encoded are performed simultaneously.

4. The encoding method according to any one of the preceding claims, in which the integers $p_1$ and $p_2$ are equal.

5. The encoding method according to any one of claims 1–3, in which sizes of all the sub-sequences are identical.

6. The encoding method according to any one of claims 1–3, in which said first and second circular convolutional encoding methods are identical.

7. The encoding method according to any one of claims 1–3, further comprising steps according to which:

an additional interleaving operation is performed, of interleaving a parity sequence ($\underline{v}_1$) resulting from said first operation of dividing into sub-sequences and encoding; and a third operation is performed, of division into sub-sequences and encoding, including dividing the interleaved sequence, obtained at the end of the additional interleaving operation, into $p_3$ third sub-sequences ($U''_i$), $p_3$ being a positive integer, and encoding each of the third sub-sequences ($U''_i$) using a third circular convolutional encoding method.

8. A device for encoding a source sequence of symbols ($\underline{u}$) as an encoded sequence, comprising:

first means for dividing into sub-sequences and encoding, for dividing the source sequence ($\underline{u}$) into $p_1$ first sub-sequences ($\underline{U}_i$), $p_1$ being a positive integer, and for encoding each of the first sub-sequences ($\underline{U}_i$) using first circular convolutional encoding means;

interleaving means for interleaving the source sequence ($\underline{u}$) into an interleaved sequence ($\underline{u}$*); and second means for dividing into sub-sequences and encoding, for dividing the interleaved sequence ($\underline{u}$*) into $p_2$ second sub-sequences ($U'_i$), $p_2$ being a positive integer, and for encoding each of the second sub-sequences ($U'_i$) using second circular convolutional encoding means, at least one of the integers $p_1$ and $p_2$ being strictly greater than 1 and at least one of the first sub-sequences ($\underline{U}_i$) not being interleaved into any of the second sub-sequences ($U'_j$).

9. The encoding device according to claim 8, in which said first or second circular convolutional encoding means have:

pre-encoding means, for defining an initial state of said encoding means for the sub-sequence in question, so as to produce a pre-encoded sub-sequence, and circular convolutional encoding means.

10. The encoding device according to claim 9, in which said pre-encoding means process one of the first sub-sequences ($\underline{U}_i$) at the same time as said circular convolutional encoding means process another of the first sub-sequences ($\underline{U}_j$) already pre-encoded.

11. The encoding device according to claim 8, 9 or 10, in which the integers $p_1$ and $p_2$ are equal.

12. The encoding device according to any one of claims 8 to 10, in which sizes of all the sub-sequences are identical.

13. The encoding device according to any one of claims 8 to 10, in which said first and second circular convolutional encoding means are identical.

14. The encoding device according to any one of claims 8 to 10, further comprising:

additional interleaving means, for interleaving a parity sequence ($\underline{v}_1$) supplied by said first means for dividing into sub-sequences and encoding; and third means for dividing into sub-sequences and encoding, for dividing the interleaved sequence, supplied by said additional interleaving means, into $p_3$ third sub-sequences ($\underline{U}''_i$), $p_3$ being a positive integer, and for encoding each of said third sub-sequences ($\underline{U}''_i$) using third circular convolutional encoding means.

15. A method for decoding a sequence of received symbols, adapted to decode a sequence encoded by an encoding method according to any one of claims 1 to 3.

16. The decoding method according to claim 15, using a turbodecoding, in which there are performed iteratively:

a first operation of dividing into sub-sequences, applied to the received symbols representing the source sequence ($\underline{u}$) and a first parity sequence ($\underline{v}_1$), and to the a priori information ($\underline{w}_4$) of the source sequence ($\underline{u}$);

for each triplet of sub-sequences representing a sub-sequence encoded by a circular convolutional code, a first elementary decoding operation, adapted to decode a sequence encoded by a circular convolutional code and supplying a sub-sequence of extrinsic information on a sub-sequence of the source sequence ($\underline{u}$);

an operation of interleaving the sequence ($\underline{w}_1$) formed by the sub-sequences of extrinsic information supplied by said first elementary decoding operation;

a second operation of dividing into sub-sequences, applied to the received symbols representing the interleaved sequence ($\underline{u}$*) and a second parity sequence ($\underline{v}_2$), and to the a priori information ($\underline{w}_2$) of the interleaved sequence ($\underline{u}$*);

for each triplet of sub-sequences representing a sub-sequence encoded by a circular convolutional code, a second elementary decoding operation, adapted to decode a sequence encoded by a circular convolutional code and supplying a sub-sequence of extrinsic information on a sub-sequence of the interleaved sequence ($\underline{u}$*);

an operation of deinterleaving the sequence ($\underline{w}_3$) formed by the extrinsic information sub-sequences supplied by said second elementary decoding operation.

17. A device for decoding a sequence of received symbols, adapted to decode a sequence encoded using an encoding device according to any one of claims 8 to 10.

18. The decoding device according to claim 17, using a turbodecoding, comprising:

first means for dividing into sub-sequences, applied to the received symbols representing the source sequence ($\underline{u}$) and a first parity sequence ($\underline{v}_1$), and to a priori information ($\underline{w}_4$) of the source sequence ($\underline{u}$);

first elementary decoding means, operating on each triplet of sub-sequences representing a sub-sequence encoded by a circular convolutional code, for decoding a sequence encoded by a circular convolutional code and supplying a sub-sequence of extrinsic information on a sub-sequence of the source sequence ($\underline{u}$);

means for interleaving the sequence ($\underline{w}_1$) formed by the sub-sequences of extrinsic information supplied by said first elementary decoding means;

second means for dividing into sub-sequences, applied to the received symbols representing the interleaved sequence ($\underline{u}$*) and a second parity sequence ($\underline{v}_2$), and to the a priori information ($\underline{w}_2$) of the interleaved sequence ($\underline{u}$*);

second elementary decoding means, operating on each triplet of sub-sequences representing a sub-sequence encoded by a circular convolutional code, for decoding a sequence encoded by a circular convolutional code and supplying a sub-sequence of extrinsic information on a sub-sequence of the interleaved sequence ($\underline{u}$*);

means for deinterleaving the sequence ($\underline{w}_3$) formed by the sub-sequences of extrinsic information supplied by said second elementary decoding means, said means of dividing into sub-sequences, of elementary decoding, of interleaving and of deinterleaving operating iteratively.

19. A digital signal processing apparatus, having means adapted to implement an encoding method according to any one of claims 1 to 3.

20. A digital signal processing apparatus, having an encoding device according to any one of claims 8 to 10.

21. A telecommunications network, having means adapted to implement an encoding method according to any one of claims 1 to 3.

22. A telecommunications network, having an encoding device according to any one of claims 8 to 10.

23. A mobile station in a telecommunications network, having means adapted to implement an encoding method according to any one of claims 1 to 3.

24. A mobile station in a telecommunications network, having an encoding device according to any one of claims 8 to 10.

25. A device for processing signals representing speech, having an encoding device according to any one of claims 8 to 10.

26. A data transmission device having a transmitter adapted to implement a packet transmission protocol, and an encoding device according to any one of claims 8 to 10.

27. A data transmission device according to claim 26, in which the protocol is of an Asynchronous Transfer Mode type.

28. A data transmission device according to claim 26, in which the protocol is of an Internet Protocol type.

29. Information storage means, which can be read by a computer or microprocessor storing instructions of a computer program, implementing an encoding method according to any one of claims 1 to 3.

30. Information storage means, which can be read by a computer or microprocessor storing instructions of a computer program, implementing a decoding method according to claim 15.

31. Information storage means, which is removable, partially or totally, which can be read by a computer or microprocessor storing instructions of a computer program, implementing an encoding method according to any one of claims 1 to 3.

32. Information storage means, which is removable, partially or totally, which can be read by a computer or microprocessor storing instructions of a computer program, implementing a decoding method according to claim 15.

33. A computer program containing sequences of instructions, implementing an encoding method according to any one of claims 1 to 3.

34. A computer program containing sequences of instructions, implementing a decoding method according to claim 15.

* * * * *

UNITED STATES PATENT AND TRADEMARK OFFICE

CERTIFICATE OF CORRECTION

PATENT NO. : 6,993,085 B2 
APPLICATION NO. : 09/826148
DATED : January 31, 2006
INVENTOR(S) : Claude Le Dantec It is certified that error appears in the above-identified patent and that said Letters Patent is hereby corrected as shown below:

ON COVER PAGE AT (56) U.S. PATENT DOCUMENTS

“6,621,873 B1 * 9/2003 Kim et al.” should read --6,621,873 B1 * 9/2003 Lee et al.--.

COLUMN 1

Line 56, “will” should read --will be--.

COLUMN 5

Line 44, “embodiment;” should read --embodiment; and--; and
Line 46, “proper” should read --properly--.

COLUMN 7

Line 2, “$U'_1$, $U'_2$, . . ., $U'_{p2}$,” should read --$\underline{U}'_1$, $\underline{U}'_2$, . . ., $\underline{U}'_{p2}$,--;
Line 6, “$U'_i$,” should read --$\underline{U}'_i$,--; “$V'_i$” should read --$\underline{V}'_i$--;
Line 7, “$U'_i$,” should read --$\underline{U}'_i$,--; “$V'_i$” should read --$\underline{V}'_i$--;
Line 23, “$g_i(x)$” should read --$g_i(x)$--;
Line 25, “$g_i(x)$.” should read --$g_i(x)$.--; and
Line 57, “$U'_j$” should read --$\underline{U}'_j$--.

COLUMN 8

Line 39, “$\hat{u}$” should read --$\underline{\hat{u}}$--; and
Line 65, “sequence$\underline{u}$” should read --sequence $\underline{u}$--.

COLUMN 9

Line 14, “r;” should read --$\underline{r}$;--;
Line 23, “from$\underline{u}$” should read --from $\underline{u}$--;
Line 41, “$\hat{U}_i$” should read --$\underline{\hat{U}}_i$--;
Line 45, “$\hat{U}_i$” should read --$\underline{\hat{U}}_i$--;
Line 46, “$\hat{u}_i$,” should read --$\underline{\hat{u}}_i$,--;
Line 51, “sequences$\underline{u}$” should read --sequences $\underline{u}$--;
Line 66, “$U'_i$” should read --$\underline{U}'_i$--; and
Line 67, “$V'_i$)” should read --$\underline{V}'_i$)--.

UNITED STATES PATENT AND TRADEMARK OFFICE

CERTIFICATE OF CORRECTION

PATENT NO. : 6,993,085 B2
APPLICATION NO. : 09/826148
DATED : January 31, 2006
INVENTOR(S) : Claude Le Dantec It is certified that error appears in the above-identified patent and that said Letters Patent is hereby corrected as shown below:

COLUMN 10

Line 10, “$U'_i$,” should read --$\underline{U}'_i$,--; and “$V'_i$,” should read --$\underline{V}'_i$,--;
Line 14, “$\hat{U}_i$.” should read --$\underline{\hat{U}}_i$.--;
Line 18, “$\hat{U}_i$” should read --$\underline{\hat{U}}_i$--;
Line 19, “$\hat{u}$*,” should read --$\underline{\hat{u}}$*,--;
Line 24, “$\hat{u}$*,” should read --$\underline{\hat{u}}$*,--;
Line 25, “$\hat{u}$,” should read --$\underline{\hat{u}}$,--;
Line 27, “$\hat{u}$” should read --$\underline{\hat{u}}$--;
Line 28, “$\hat{u}$*;” should read --$\underline{\hat{u}}$*;--;
Line 34, “$\hat{u}$,” should read --$\underline{\hat{u}}$,--;
Line 35, “$\hat{u}$” should read --$\underline{\hat{u}}$--;
Line 45, “sequence$\underline{u}$” should read --sequence $\underline{u}$--;
Line 55, “$g_1(x)$,” should read --$g_1(x)$,--;
Line 56, “$\underline{h}_1(x)$,” should read --$h_1(x)$,--;
Line 58, “sequences$\underline{u}$” should read --sequences $\underline{u}$--;
Line 59, “/$g_1$),” should read --/$g_1$),--; and
Line 62, “sequences$\underline{u}$” should read --sequence $\underline{u}$--.

COLUMN 11

Line 3, “$U'_i$,” should read --$\underline{U}'_i$,--;
Line 4, “$g_2(x)$,” should read --$g_2(x)$,--;
Line 5, “$\underline{h}_2(x)$,” should read --$h_2(x)$,--;
Line 6, “$V'_i$.” should read --$\underline{V}'_i$.--;
Line 8, “$V'_i(=U'_i$·” should read --$\underline{V}'_i(=\underline{U}'_i$·--;
Line 11, “$V'_i$)” should read --$\underline{V}'_i$)--;
Line 36, “$\hat{u}$” should read --$\underline{\hat{u}}$--;
Line 38, “$\hat{u}$” should read --$\underline{\hat{u}}$--;
Line 54, “u” should read --$\underline{u}$--; and
Line 67, “$\hat{U}_j$” should read --$\underline{\hat{U}}_i$--.

COLUMN 12

Line 33, “$U'_i$)” should read -- $\underline{U}'_i$)--;
Line 34, “$U'_i$)” should read -- $\underline{U}'_i$)--;
Line 35, “$\hat{U}'_i$)” should read -- $\underline{\hat{U}}'_i$)--; and $\hat{U}'_i$.” should read --$\underline{\hat{U}}'_i$.--;
Line 53, “$\hat{u}$*,” should read --$\underline{\hat{u}}$*,--;
Line 54, “$\hat{U}'_i$” should read --$\underline{\hat{U}}'_i$--; and
Line 57, “$\hat{u}$,” should read --$\underline{\hat{u}}$,--.

UNITED STATES PATENT AND TRADEMARK OFFICE

CERTIFICATE OF CORRECTION

PATENT NO. : 6,993,085 B2

APPLICATION NO. : 09/826148

DATED : January 31, 2006

INVENTOR(S) : Claude Le Dantec

It is certified that error appears in the above-identified patent and that said Letters Patent is hereby corrected as shown below:

COLUMN 13

Line 9, “$U''_i$;” should read --$\underline{U}''_i$--; and
Line 11, “$U'_i$.” should read --$\underline{U}'_i$.--.
Line 21, “($\underline{U}'_i$) $p_1$” should read --($\underline{U}_i$), $p_1$--; and
Line 31, “($U'_i$),” should read --($\underline{U}_i$),--.

COLUMN 14

Line 2, “($U''_i$)” should read --($\underline{U}''_i$)--;
Line 15, “($U'_i$),” should read --($\underline{U}'_i$),--;
Line 17, “($U'_i$),” should read --($\underline{U}'_i$),--; and
Line 21, “($U'_j$).” should read --($\underline{U}'_j$).--.

COLUMN 15

Line 15, “($\underline{u}$*);” should read --($\underline{u}$*); and--; and
Line 48, “($\underline{u}$*);” should read --($\underline{u}$*); and--.

Signed and Sealed this

Nineteenth Day of December, 2006

JON W. DUDAS

*Director of the United States Patent and Trademark Office*